INVENTOR.
Louis W. Schreiner
BY
Foorman L. Mueller
ATTY

May 12, 1953 L. W. SCHREINER 2,638,544

CAVITY TUNER

Filed Sept. 15, 1948 3 Sheets-Sheet 2

*INVENTOR.*
Louis W. Schreiner

*BY*

Norman L. Mueller

ATTY.

May 12, 1953 L. W. SCHREINER 2,638,544

CAVITY TUNER

Filed Sept. 15, 1948 3 Sheets-Sheet 3

INVENTOR.
Louis W. Schreiner
BY
Foorman L. Mueller
ATTY.

Patented May 12, 1953 2,638,544

UNITED STATES PATENT OFFICE 2,638,544

CAVITY TUNER

Louis W. Schreiner, Des Plaines, Ill., assignor to Raytheon Television and Radio Corporation, a corporation of Illinois Application September 15, 1948, Serial No. 49,382

11 Claims. (Cl. 250—31)

This invention relates generally to resonant tuning systems and more particularly to a tunable cavity for use at ultra high radio frequencies.

In developing a tuning system for use in electronic equipment which operates at ultra high radio frequencies, many problems not involved when operating at lower frequencies are encountered. The value of inductance required at such frequencies is very low and accordingly coils as used at lower frequencies are not practicable. Systems resonant at ultra high frequencies have been provided by the use of resonant lines and cavities which provide inductance and capacitance of the desired order of magnitude. Although it has been proposed to make such systems tunable through a range of frequencies, the structures to accomplish this have been complicated and not entirely satisfactory in operation. When using the tuning system in an electronic wave receiver it is desirable in many instances that the system be tunable through a relatively large band of frequencies and that the variation of frequency with mechanical movement of the tuner be substantially linear so that the tuning is made easier throughout the band. Also in certain applications it is desired to use the receivers to continuously sweep through the band of frequencies and for such use the tuning system must be adapted to be operated at a high rate of speed with the frequency varying substantially linearly with time.

It is, therefore, an object of the present invention to provide a simple variable tuning system for use at ultra high frequencies.

Another object of this invention is to provide an improved tuning system for use with ultra high frequencies which is continuously tunable through a range of frequencies and which may be operated through the range of frequencies at high speed.

A further object of this invention is the provision of an ultra high frequency tuning system in which the frequency is determined by the position of a rotary member and in which the relation between the frequency and the angle of rotation is substantially linear.

It is a still further object of this invention to provide an ultra high frequency tuning system which is suitable for use with the preselector, oscillator, and converter of a superheterodyne receiver system and in which the various units may be ganged for simultaneous operation.

A feature of this invention is the provision of a resonant cavity having a movable conducting member therein so that the frequency to which the cavity is resonant may be varied by movement of the member.

A further feature of this invention is the provision of a cylindrical cavity having an insulating rotor with a conducting surface mounted therein, in which the conducting surface is so shaped that movement of the rotor is effective to tune the cavity through a band of frequencies and the frequency varies substantially linear with the angle of rotation.

Still another feature of this invention is the provision of a resonant cavity which is tuned by varying the capacity of a condenser which is effectively shunted thereacross and in which the position of the condenser is shifted without the use of sliding contacts.

A still further feature of this invention is the provision of a tuning system in which a plurality of cavities are used to tune successive stages of a receiver and in which the cavities include rotors so arranged and interconnected that the various stages are simultaneously tuned to frequencies having the desired interrelation.

Further objects, features and advantages will be apparent from a consideration of the following description taken in connection with the accompanying drawings in which.

In practicing the invention there is provided a cavity, preferably of cylindrical configuration, which is made of conducting material. A conducting post is provided in the cavity which extends from one cylindrical side along a diameter substantially to the opposite side of the cavity. A pair of rotors are movably supported in the cavity and positioned on either side of the post. Bearings are provided in the circular or end walls of the cavity for supporting an insulating shaft upon which the rotors are mounted. The rotors are made of insulating material having conducting surfaces on a portion thereof. It will be apparent to those skilled in the art that an inductance of fixed value will be present between the end of the post and the adjacent portion of the cavity. Certain electrical capacity will also exist between the center post and the adjacent portion of the cavity and the value of the capacitance will depend upon the position of the conducting portion of the rotor with respect to the center post and walls of the cavity. Movement of the rotors will, therefore, cause a variable capacity which is effective to resonate with the fixed inductance of the cavity so that the cavity is resonant at varying frequencies. By connecting coupling members to the post in the cavity adjacent the end thereof the cavity can be used as a selective filter as in the preselector of a radio receiver. An adjustable member may be secured to the cavity adjacent the end of the post so that the effective distance between the post and the cavity is varied. This will provide a trimmer condenser across the cavity which may be adjusted to vary the resonant frequency through a limited range. The cavity can be used in the output circuit of an oscillator to control the frequency thereof and may also be used with a detector as the converter stage in a superheterodyne receiver. Tuning units which are used in the preselector, oscillator, and converter of a superheterodyne radio receiver may be ganged together by coupling the shafts on which the rotors are mounted to provide tuning by single control in the same manner as provided by variable rotor condensers for low frequency operation.

Figure 2:
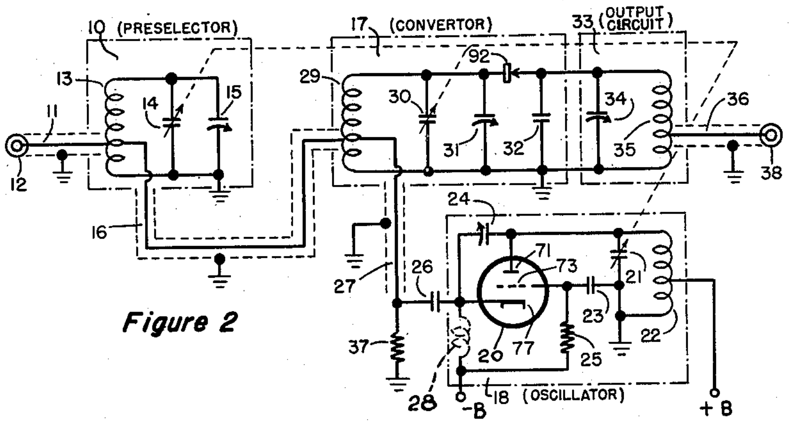
Fig. 2 is a circuit diagram of the system of Fig. 1.
Figure 1:
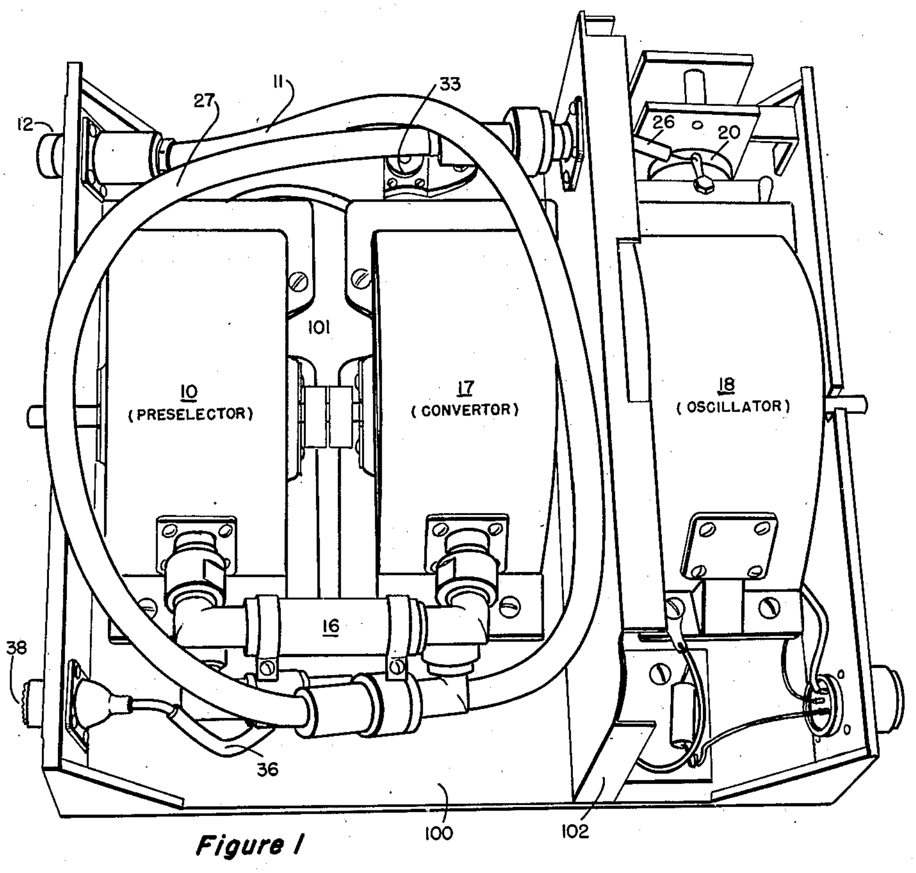
Fig. 1 illustrates a superheterodyne radio frequency system using tunable cavities in accordance with the invention.
Figures 3, 4, 5:
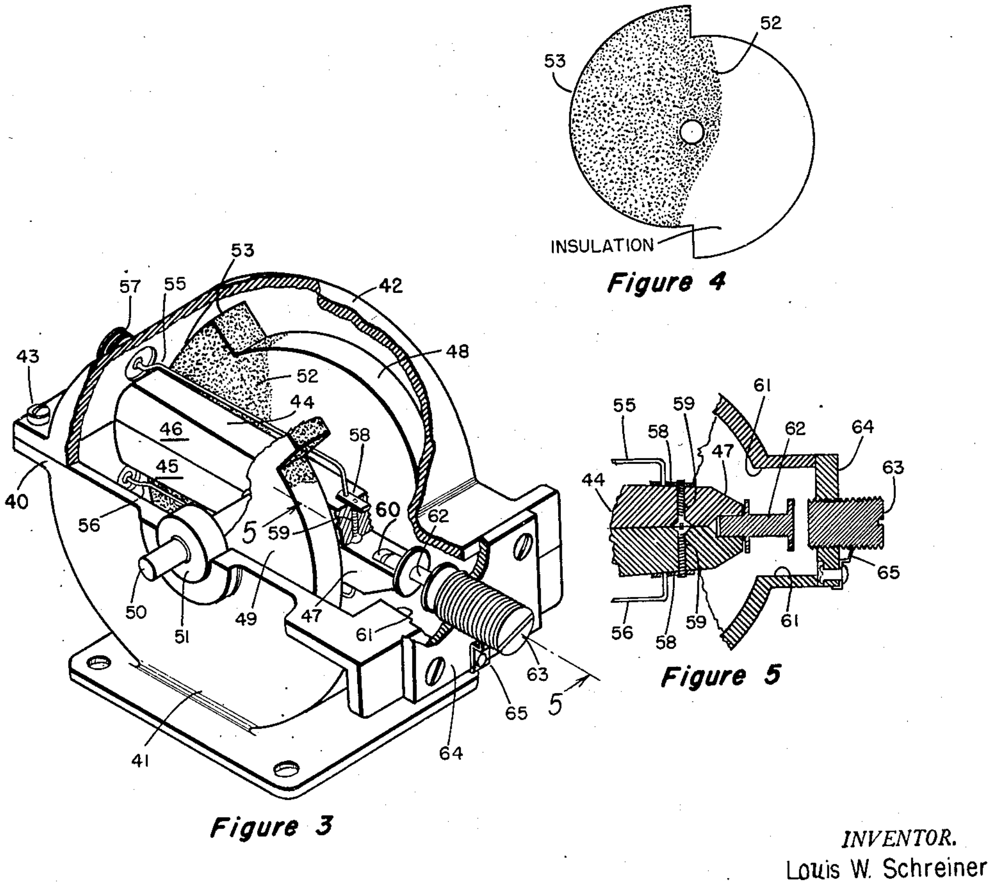
Fig. 3 illustrates the construction of a tunable cavity in accordance with the invention.
Fig. 4 illustrates the configuration of a rotor of the cavity.
Fig. 5 is a detailed cross-sectional view along the lines 5—5 of Fig. 3.

Referring now to the drawings, Figs. 1 and 2 illustrate the use of the cavity tuners in the radio frequency portion of a superheterodyne receiver. The unit includes a preselector 10 which is connected by coaxial cable 11 to an antenna terminal 12. The preselector is a cavity having inductance 13, variable capacity 14 and adjustable fixed capacity 15. The physical structure of the cavity unit which will operate in this manner is illustrated in Fig. 3 and will be described more in detail hereinafter. The preselector operates as a filter with the output being applied through cable 16 to the converter 17. An oscillator 18 is provided which includes a cavity having a lighthouse type tube 20 operatively connected thereto. The cavity itself forms the inductance 22 and the variable condenser 21 shown in Fig. 2 with the condensers 23 and 24 and resistor 25 being coupled thereto in a manner to be described in connection with Fig. 7. The output from the oscillator is applied through condenser 26 and coaxial cable 27 to the converter 17. The converter 17 mixes the input from the preselector 10 and the oscillator 18 to provide a signal of intermediate frequency. The converter 17 includes a cavity which forms the inductance 29 and the variable capacitor 30 and to which is coupled condensers 31 and 32 and crystal detector 92. The intermediate frequency signal appears across condenser 32 which is connected in parallel with the output circuit 33 including condenser 34 and inductor 35, which may be of standard construction. The output signal is transmitted by coaxial cable 36 to the terminal 38 which may be connected to a succeeding stage, as for example, the first intermediate frequency stage.

Reference is now made to Figs. 3 and 5 which illustrate the physical construction of a cavity tuner such as that illustrated as the preselector in Figs. 1 and 2. The cavity is formed by a conducting housing 40 having a base portion 41 and a top portion 42. Each portion forms half of the cylindrical cavity with the portions being secured together by any suitable manner as by screws 43. A center post 44 is provided in the cavity including portion 45 which is integral with the base portion 41 of the cavity and portion 46 which is integral with the top portion 42 of the cavity. The center post extends within the cavity and has an end 47 which is spaced from a recess portion 61 in the cylindrical wall of the cavity. A pair of rotors 48 and 49 are supported on a shaft 50 which is mounted for rotation in bearings 51 in the circular or end walls of the cavity. The rotors 48 and 49 are made of insulating material and are of a configuration as illustrated in Fig. 4. A conducting surface is provided on a portion of the sides of the rotors adjacent the center post 44 as indicated at 52. The conducting coating is also placed on certain portions of the edge of the rotor as indicated at 53.

For applying signals to the cavity, coupling loops 55 and 56 are provided. The coupling loops are connected to coaxial fittings 57 positioned in the cylindrical wall of the cavity adjacent the base of the center post 44. The loops are connected to the center post adjacent the end 47 thereof by lugs 58 which are secured to the center post by screws 59 extending in openings provided in the post. The loops may be made of wire or conducting strips with the cross section and configuration of the loops being selected to provide the desired degree of coupling in a particular application. In order to provide an adjustable fixed capacity across the cavity (condenser 15, Fig. 2) a stud 62 is provided in the opening 60 and rigidly mounted in the post 44. The stud cooperates with a screw 63 threaded in the closure plate 64 of the recess 61. It is obvious that by adjusting the position of the screw 63 the capacity between the screw and the stud 62 will be varied to form in effect a trimmer condenser across the cavity. A spring clip 65 is provided for preventing unintentional movement of the screw 63 to accidentally change the setting of the trimmer condenser.

Figure 6:
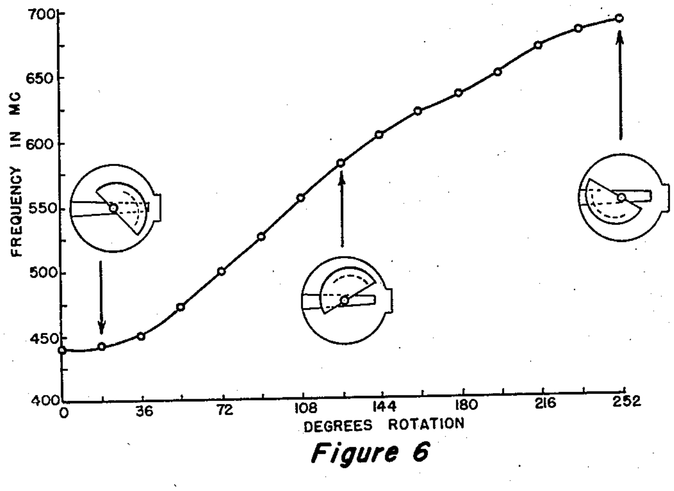
Fig. 6 is a curve chart showing the frequency versus rotation characteristic of the tunable cavity.

Considering now the operation of the resonant cavity, it is well known that the cavity forms both an inductance and a capacitance between the end 47 of the post 44 and the recess 61 in the cavity. This is represented in Fig. 2 as the inductance 13 and the variable condenser 14. The inductance remains substantially fixed not being affected by the rotors which are non-magnetic. However, the conducting surfaces on the rotors have the effect of changing the capacity between the post and the walls of the cavity and also changing the effective position at which the capacity is coupled to the inductance of the cavity. The conducting surface in effect forms a movable plate between the post and the cavity so that the capacity therebetween changes. As the cavity is symmetrical the variation in capacity depends upon the position of the conducting surface with respect to the post. The change in capacity with rotation of the rotor depends upon the shape of the conducting surface. It is apparent that when using an unsymmetrical conducting surface as illustrated, the capacity shifts to various positions along the post and it has been found that when the capacity is adjacent the end of the post the effect is to lower the resonant frequency whereas when the capacity is adjacent the base of the post the effect is to raise the resonant frequency of the cavity. In Fig. 6 there is illustrated the relationship between the resonant frequency of the cavity and the angular position of the rotor. By properly shaping the conducting surface this characteristic can be made substantially linear. To adjust the degree of linearity, rotors may be staggered as illustrated in Fig. 3 with best results being obtained when the position is shifted by approximately 70 to 90 degrees.

The resonant frequency of the cavity depends upon the inductance which is controlled by the diameter of the cavity and the length of the post, and the capacity which depends upon the configuration of the conducting surface of the rotors and the post. The surface area between the post and the rotor is important as this area governs the maximum capacity variation and, therefore, the tuning range of the cavity. By placing the conducting surface on the side of the rotor adjacent the center post and by adjusting the space between the rotor and the post the capacity variation can be controlled. As previously stated, when the cavity is used as a converter or preselector, the construction of the coupling loops also affects the characteristics of the cavity, it having been found that by decreasing the coupling the band width is narrowed and the gain is reduced.

Figures 7, 8, 9, 10:
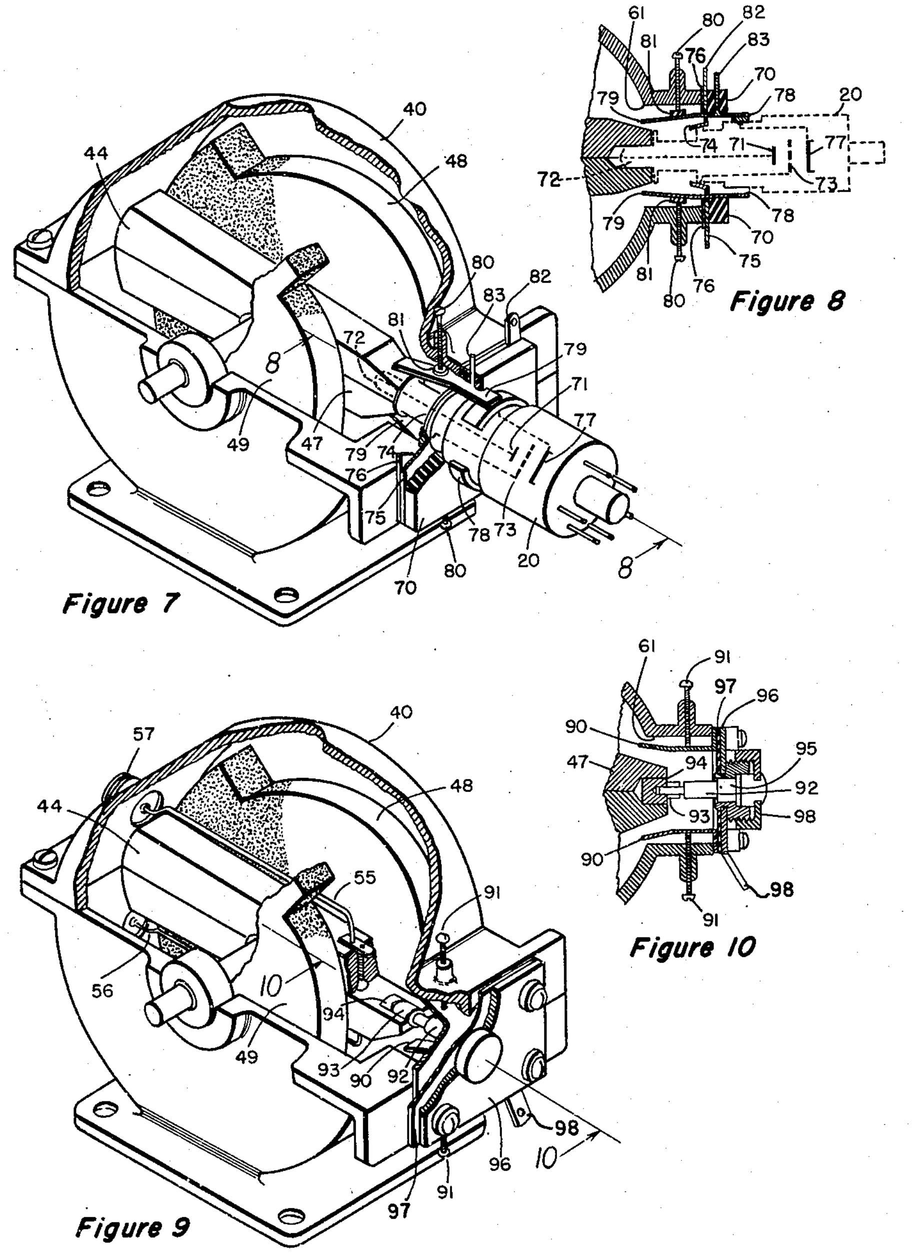
Fig. 7 illustrates a tunable cavity construction suitable for use as an oscillator.
Fig. 8 is a cross-sectional view along the lines 8—8 of Fig. 7.
Fig. 9 illustrates a tunable cavity suitable for use as a converter.
Fig. 10 is a cross-sectional view along the lines 10—10 of Fig. 9.

As previously stated the cavity tuner is also suitable for tuning an oscillator or a converter. In Figs. 7 and 8 an oscillator tuned by the resonant cavity is illustrated. The housing 40, rotors 48 and 49 and post 44 may be identical to the corresponding components of Fig. 3. The inductance of the cavity is represented by 22 and the variable capacity by 21 in Fig. 2. However, as the cavity is used as a tuning circuit of an oscillator it is coupled to a tube 20 for controlling the frequency of oscillations produced thereby. In the drawings a lighthouse tube is illustrated mounted on an insulating closure plate 70 which is secured to the recessed portion 61 of the housing. The plate 71 of the tube is connected to the top terminal 72 of the tube which engages the end 47 of the post 44. The grid 73 of the tube is connected through a conducting ring 74 on the tube to conducting plate 75. A dielectric plate 76 is provided between the plate 75 and the housing to form a condenser between the grid 73 and the cavity. This condenser is represented by the condenser 23 in the circuit diagram of Fig. 2. The cathode 77 of the tube is connected through conducting ring 78 to conducting strips 79 which extend in proximity to the end 47 of the post 44 to provide a feed-back coupling between the cathode 77 and the plate 71. This is represented in the circuit diagram (Fig. 2) by the condenser 24. At the very high frequencies of operation of the oscillator 24, the lead from the cathode to B—(Fig. 2) has appreciable reactance, as represented by the choke 28 shown by dotted lines, to prevent the apparent short circuiting of the cathode 77 and output circuit of the oscillator. Thus in effect the oscillation circuit 24 is a form of Colpitts oscillator. The value of the condenser 24 can be adjusted by screws 80 which adjust the position of the ends of the strips 79 with respect to the post 44. Insulating members 81 are positioned between the ends of the screws 80 and the strips 79. Terminals 82 and 83 are provided for making connections to plate 76 and the strips 79 respectively. As is obvious from Fig. 2 the variation in the value of the condenser 22 produced by rotation of the rotors 48 and 49 in the cavity will change the frequency of the oscillator.

In Figs. 9 and 10 the use of the resonant cavity in a converter stage is illustrated. The housing 40, center post 44 and rotors 48 and 49 may be identical to the corresponding elements of Figs. 3 and 7. Coupling loops 55 and 56 are provided as in Figs. 3 and 7 with the loops being adapted to be connected to coaxial lines from the preselector and oscillator (16 and 27 in Fig. 2). As previously stated the cavity forms a fixed inductance 29 and the rotation of the rotors in the cavity provides a variable capacity 30 which may be considered to be shunted across the inductance. An adjustable fixed capacity is provided by the clips 90 secured to the housing in the opening in the recess 61. The capacity between the clips 90 and the end 47 of the post 44 can be adjusted by adjusting screws 91 so that what is generally considered a trimmer condenser is provided. This condenser is indicated by 31 in Fig. 2. A crystal detector 92 is provided including a terminal 93 supported in a recess 94 in the end 47 of the post 44 and a second terminal 95 supported on plate 96 secured to the housing 40. A removable screw cap 98 is provided to permit easy removal of the crystal. A dielectric plate 97 is provided between the plate 96 and the base portion which supports clips 90 to form a condenser therebetween. This condenser is illustrated at 32 in the circuit of Fig. 2 and the detector 92 is shown connected to 32 in the circuit diagram. The output of the converter is obtained between the terminal 98 connected to plate 96 and the housing of the cavity and may then be applied to a tuned output circuit as illustrated at 33 in Fig. 2.

When the preselector, oscillator, and converter as above described are used together in a superheterodyne receiver, the various units may be mounted together on a sub-chassis 100 as illustrated in Fig. 1. The shafts may be connected by couplers 101 so that they rotate simultaneously to provide ganged operation. As the frequency characteristics of the cavities are substantially linear with the angle of rotation of the rotors, the units will keep the desired frequency relation throughout a band of frequencies. In such a unit it may be preferable to provide a shield as indicated at 102 between the oscillator and the remaining units to prevent excessive coupling therebetween.

Cavity tuning units in accordance with the invention have been developed for operation in various frequency ranges including the following:

250–500 megacycles
500–800 megacycles
800–1200 megacycles

Cavities for operating at such frequencies are sufficiently small and are therefore suitable for use in small receivers. Such tuners are suitable for use in receivers which are arranged to sweep though a band of frequencies at high speed and are also suitable for normal continuous tuning. The balance of the rotors and the construction of the bearings, of course, need not be as accurate when the units are not used for high speed sweep tuning. Accurate tuning at ultra high frequencies is obtained by the cavity tuners in accordance with the invention with high gain as compared to presently available tuning systems. Ganging of the various stages is easily accomplished, it being obvious that the system can also be used where a plurality of tuned radio frequency stages are required.

While there are described certain embodiments of the invention which are illustrative thereof, it is obvious that various changes and modifications can be made therein without departing from the intended scope of the invention as defined in the appended claims.

I claim:

1. A tunable resonant system comprising a conducting housing having an inductive cavity therein, a conducting post secured to said housing and extending into said cavity and having an end which is spaced from a portion of said cavity, a disc member having an unsymmetrical conducting surface thereon movable adjacent said post within said cavity, the movement of said disc member with respect to said cavity and said post being effective to vary the capacity between said post and said cavity to form a tunable resonant circuit, said portion of said cavity having an opening therein, a conducting plate adapted to cover said opening, a rectifying element having the terminals thereof individually connected to said post and said plate, and an annular sheet of dielectric material about said rectifying element and positioned between said plate and said cavity to form a condenser which is connected in series with said rectifying element across said resonant circuit.

2. A tunable resonant system comprising a conducting housing having an inductive cavity therein, a conducting post secured to said housing and extending into said cavity and having an end which is spaced from a portion of said cavity, a disc member having an unsymmetrical conducting surface thereon rotatable adjacent said post within said cavity, the rotation of said disc member with respect to said cavity and said post being effective to vary the capacity between said post and said cavity to form a tunable resonant circuit, said portion of said cavity having an opening therein, a conducting plate adapted to cover said opening, a rectifying element having the terminals thereof individually connected to said post and said plate, an annular sheet of dielectric material about said rectifying element and positioned between said plate and said cavity to form a condenser which is connected in series with said rectifying element across said resonant circuit, and adjustable means connected to said portion of said cavity and extending adjacent to said end of said post to form a trimmer condenser across said resonant circuit.

3. A tunable resonant system comprising a conducting housing having an inductive cavity therein, a conducting post secured to said housing and extending into said cavity and having an end which is spaced from a portion of said cavity, a disc member having an unsymmetrical conducting surface thereon movable adjacent said post within said cavity, the movement of said conducting surface with respect to said cavity and said post being effective to vary the capacity between said post and said cavity to form a tunable resonant circuit, said portion of said cavity having an opening therein, a conducting plate adapted to cover said opening, an electron discharge valve having a cathode, grid and plate supported on said plate with the grid thereof connected to said plate, said valve including a terminal connected to the plate thereof which engages said end of said post when said plate is secured to said opening, and an annular sheet of dielectric material about said electron discharge valve and positioned between said plate and said cavity to form a condenser which is connected in series with said resonant circuit between said plate and said grid of said valve.

4. A tunable resonant system comprising a conducting housing having an inductive cavity therein, a conducting post secured to said housing and extending into said cavity and having an end which is spaced from a portion of said cavity, a disc member having an unsymmetrical conducting surface thereon and rotatable within said cavity, the rotation of said conducting surface with respect to said cavity and said post being effective to vary the capacity between said post and said cavity to form a tunable resonant circuit, said portion of said cavity having an opening therein, a conducting plate adapted to cover said opening, an electron discharge valve having a cathode, grid and plate supported on said plate with the grid thereof connected to said plate, said valve including a terminal connected to the plate thereof which engages said end of said post when said plate is secured to said opening, an annular sheet of dielectric material about said electron discharge valve and positioned between said plate and said cavity to form a condenser which is connected in series with said resonant circuit between said plate and said grid of said valve, and conducting strips connected to said cathode which extend adjacent said end of said post to provide capacitive coupling therebetween.

5. A tunable resonant system comprising a conducting housing having an inductive cavity therein, a conducting post secured to said housing and extending into said cavity and having an end which is spaced from a portion of said cavity, a disc member having an unsymmetrical conducting surface thereon movable adjacent said post within said cavity, the movement of said conducting surface with respect to said cavity and said post being effective to vary the capacity between said post and said cavity, and adjustable means connected to said portion of said cavity and having a conducting surface extending adjacent to said end of said post to form a trimmer condenser between said end of said post and said conducting surface.

6. A tunable resonant system comprising a conducting housing having conducting walls forming an inductive cylindrical cavity therein, a conducting post extending into said cavity along a diameter thereof, said post having an end spaced from said cavity, and a disc member mounted for movement in said cavity and having an unsymmetrical conducting surface thereon, said conducting surface, said conducting post and said conducting cavity walls forming capacitor means which is in effect shunted across said inductance, said conducting surface moving with respect to said conducting post and said cavity wall as said member is moved to vary the capacity of said capacitor means and thereby provide a system resonant at a frequency which depends on the position of said member in said cavity.

7. A tunable resonant system including in combination, conducting wall means defining a resonant cavity of generally cylindrical configuration having inductance and capacitance, a conducting post extending radially within said cavity, and a disc member positioned entirely within said cavity and mounted for rotation therein in a plane parallel to said conducting post, said member having an unsymmetrical conducting surface thereon which together with said wall means and said conducting post forms a condenser which is in effect shunted across at least a portion of said inductance to form a resonant circuit, said conducting surface being so unsymmetrically shaped that the portions of said wall means adjacent said conducting surface change with the angular position of said disc member to thereby vary the coupling of said condenser to said inductance and change the frequency at which said circuit is resonant.

8. A tunable resonant system comprising a conducting housing having conducting walls forming an inductive cavity therein, a conducting post secured to said housing and extending into said cavity and having an end which is spaced from a portion of said cavity, a disc member having an unsymmetrical conducting surface thereon and rotatable adjacent said post within said cavity, said conducting wall and said conducting post forming capacitor means which is in effect shunted across said inductance to provide a resonant system having a frequency which depends on the rotatable position of said member in said cavity, a loop for coupling to said resonant system extending along said post and connected thereto adjacent the end thereof, and a fitting on said housing having a terminal insulated from said housing and connected to said loop.

9. A tunable resonant system comprising a conducting housing having conducting walls forming an inductive cavity therein, a conducting post secured to said housing and extending into said cavity and having an end which is spaced from a portion of said cavity, a disc member having an unsymmetrical conducting surface thereon rotatable adjacent said post within said cavity, the movement of said conducting surface with respect to said conducting walls and said post by rotation of said member being effective to vary the capacity between said post and said cavity, adjustable means connected to said portion of said cavity and having a conducting portion extending adjacent to said end of said post to form a trimmer condenser between said end of said post and said cavity, and input and output coupling loops extending along said post on opposite sides thereof, said loops being connected to said post adjacent said end thereof for coupling to the resonant system formed between said post and said cavity.

10. A tunable resonant system including in combination, a conducting housing having conducting walls forming an inductive cavity of generally cylindrical configuration, a conducting post extending radially within said cavity, a disc member having an unsymmetrical conducting surface thereon positioned entirely within said cavity and movable therein in a plane parallel to said conducting post, said conducting surface, said conducting post and said conducting walls providing capacitor means effectively connected across the inductance of said cavity to form a resonant circuit, movement of said member with respect to said conducting post being effective to vary the capacity of said capacitor means to tune said resonant circuit, a rectifying element, and means secured to said housing forming a condenser, said means including a portion supporting said rectifying element and connecting the same in series with said condenser across said resonant circuit.

11. A tunable resonant system including in combination, conducting wall means defining a resonant cavity of generally cylindrical configuration having inductance and capacitance, a conducting post extending radially within said cavity, a disc member positioned entirely within said cavity and mounted for rotation therein in a plane parallel to said conducting post, said member having an unsymmetrical conducting surface thereon which together with said wall means and said conducting post forms a condenser which is in effect shunted across at least a portion of the inductance of said cavity to form a resonant circuit, an electron discharge valve having cathode, grid and plate electrodes, and means secured to said housing and supporting said electron discharge valve thereon, said last named means including a portion forming a second condenser and means connecting said second condenser in series with said resonant circuit of said cavity between said plate and grid electrodes of said valve.

LOUIS W. SCHREINER.

References Cited in the file of this patent

UNITED STATES PATENTS

| Number | Name | Date |
|---|---|---|
| 1,589,925 | Batcher | June 22, 1926 |
| 1,925,828 | Woll | Sept. 5, 1933 |
| 1,933,778 | West | Nov. 7, 1933 |
| 2,223,835 | Smith | Dec. 3, 1940 |
| 2,306,282 | Samuel | Dec. 22, 1942 |
| 2,396,044 | Fox | Mar. 5, 1946 |
| 2,425,352 | Sloss | Aug. 12, 1947 |
| 2,426,992 | Folland et al. | Sept. 9, 1947 |
| 2,427,100 | Kihn | Sept. 9, 1947 |
| 2,433,386 | Montgomery | Dec. 30, 1947 |
| 2,451,825 | Guarrera | Oct. 19, 1948 |
| 2,469,222 | Atwood | May 3, 1949 |
| 2,488,545 | Lader | Nov. 22, 1949 |
| 2,491,480 | Davis | Dec. 20, 1949 |
| 2,492,996 | Haxby | Jan. 3, 1950 |
| 2,523,128 | Macdonald | Sept. 19, 1950 |